United States Patent
Kondo (10) Patent No.: US 10,707,834 B2
(45) Date of Patent: Jul. 7, 2020

(54) VARIABLE ATTENUATOR

(71) Applicant: SUMITOMO ELECTRIC DEVICE INNOVATIONS, INC., Kanagawa (JP)

(72) Inventor: Makoto Kondo, Yokohama (JP)

(73) Assignee: SUMITOMO ELECTRIC DEVICE INNOVAITONS, INC., Kanagawa (JP)

( * ) Notice: Subject to any disclaimer, the term of this patent is extended or adjusted under 35 U.S.C. 154(b) by 0 days.

(21) Appl. No.: 16/295,656

(22) Filed: Mar. 7, 2019

(65) Prior Publication Data

US 2019/0280671 A1 Sep. 12, 2019

(30) Foreign Application Priority Data

Mar. 8, 2018 (JP) ................................. 2018-041658

(51) Int. Cl.
*H03H 11/24* (2006.01)
*H03K 5/01* (2006.01)

(52) U.S. Cl.
CPC ............ *H03H 11/245* (2013.01); *H03K 5/01* (2013.01)

(58) Field of Classification Search
CPC ....... H01L 2924/00; H01L 2924/00014; H01L 2924/0002; H01L 2924/48091; H01L 2924/3011; H03H 11/245; H01P 1/22; H01P 1/227
See application file for complete search history.

(56) References Cited

U.S. PATENT DOCUMENTS

| | | | |
|---|---|---|---|
| 9,602,091 B1* | 3/2017 | Sharma | H03H 7/24 |
| 2003/0132814 A1* | 7/2003 | Nyberg | H01P 1/227 |
| | | | 333/81 R |
| 2005/0118971 A1 | 6/2005 | Arai et al. | |
| 2019/0140623 A1* | 5/2019 | Tiller | H03H 11/245 |

FOREIGN PATENT DOCUMENTS

| | | |
|---|---|---|
| JP | 10-261925 | 9/1998 |
| JP | 2000-357927 | 12/2000 |
| JP | 2005-159803 | 6/2005 |

* cited by examiner

*Primary Examiner* — Sibin Chen
(74) *Attorney, Agent, or Firm* — Smith, Gambrell & Russell, LLP.

(57) ABSTRACT

A variable attenuator operable in a frequency band from at least 10 GHz is disclosed. The variable attenuator includes an input port; an output port; a first transmission line connecting the input port with the output port; an attenuating unit provided between the first transmission line and the ground; and a second transmission line. The attenuating unit includes at least one transistor with two current terminals coupled with the first transmission line and ground, respectively. The second transmission line is coupled between the two current terminals of the transistor. The second transmission line is operable as an inductor in the frequency band. A feature of the variable attenuator is that the transistor and the second transmission line cause a resonance frequency within the frequency band by a capacitor between the two current terminals and the inductance of the second transmission line.

13 Claims, 4 Drawing Sheets

VARIABLE ATTENUATOR

CROSS REFERENCE TO RELATED APPLICATION

The present application is based on and claims benefit of priority of Japanese Patent Application No. 2018-041658, filed on Mar. 8, 2018, the entire content of which is incorporated herein by reference.

BACKGROUND OF INVENTION

1. Field of Invention

The present invention relates to a variable attenuator, in particular, the invention relates to a variable attenuator for radio frequency (RF) signals.

2. Background Arts

A Japanese Patent Application laid open No. jp2000-357927a has disclosed a linearizer configured by, what is called, a T-type attenuator. Specifically, the linearizer disclosed therein includes first and second resistors connected in series, a third resistor in one terminal thereof being connected with an intermediate terminal between the former two resistors to form a T-character, a field effect transistor (FET) connected with another terminal of the third resistor and operable as a variable resistor, and an inductor operable as a reactance element and provided between the FET and the ground. Another Japanese Patent Application laid open No. jp2005-159803a has disclosed an amplifier applicable to high frequencies. The high frequency amplifier disclosed therein includes a transistor that receives a high frequency signal in a control terminal thereof and outputs an amplified high frequency signal in one of the current terminals thereof. The high frequency amplifier further includes a variable attenuator provided between the control terminal of the transistor and an input terminal of the amplifier. The variable attenuator includes a capacitor and a switching transistor connected in series with the capacitor between a signal line and the ground. Turning on and off the switching transistor, the signal carried on the signal line may be attenuated.

A variable attenuator has been known in the field where the variable attenuator is configured with several transistors between a signal line and the ground, and the attenuation thereof may be adjusted by selecting the transistors to be turned on. Such an attenuator preferably shows no signal loss when all transistors are turned off. However, parasitic capacitance inherently attributed to a transistor, specifically, between two current terminals of the transistor, may form a leak pass from the signal line to the ground even when the transistor turns off, which makes hard to realize no-loss, or to reduce loss for the signal carried on the signal line.

SUMMARY OF INVENTION

An aspect of the present invention relates to a variable attenuator that is operable in a frequency band with a lowest range of at least 10 GHz. The variable attenuator comprises an input port, an output port, a first transmission line, an attenuating unit, and a second transmission line. The first transmission line connects the input port with the output port. The attenuating unit, which is provided between the first transmission line and the ground, and between the input port and the output port, includes at least one transistor having two current terminals coupled with the first transmission line and the ground, respectively. The second transmission line, which is connected between the two current terminals of the transistor, operates as an inductor. The transistor and the second transmission line cause a resonance frequency formed by a capacitor inherently attributed between the two current terminals of the transistor and the inductor attributed to the second transmission line A feature of the variable attenuator of the invention is that the resonance frequency is set within the frequency band.

BRIEF DESCRIPTION OF DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present invention will be described referring to drawings. The present invention, however, is not restricted to those embodiments, and has a scope defined in claims attached hereto and all changes and modifications of elements in the claims and equivalent thereto. Also, in the description of the drawings, numerals or symbols same with or similar to each other will refer to elements same with or similar to each other without duplicating explanations.

Figure 1:
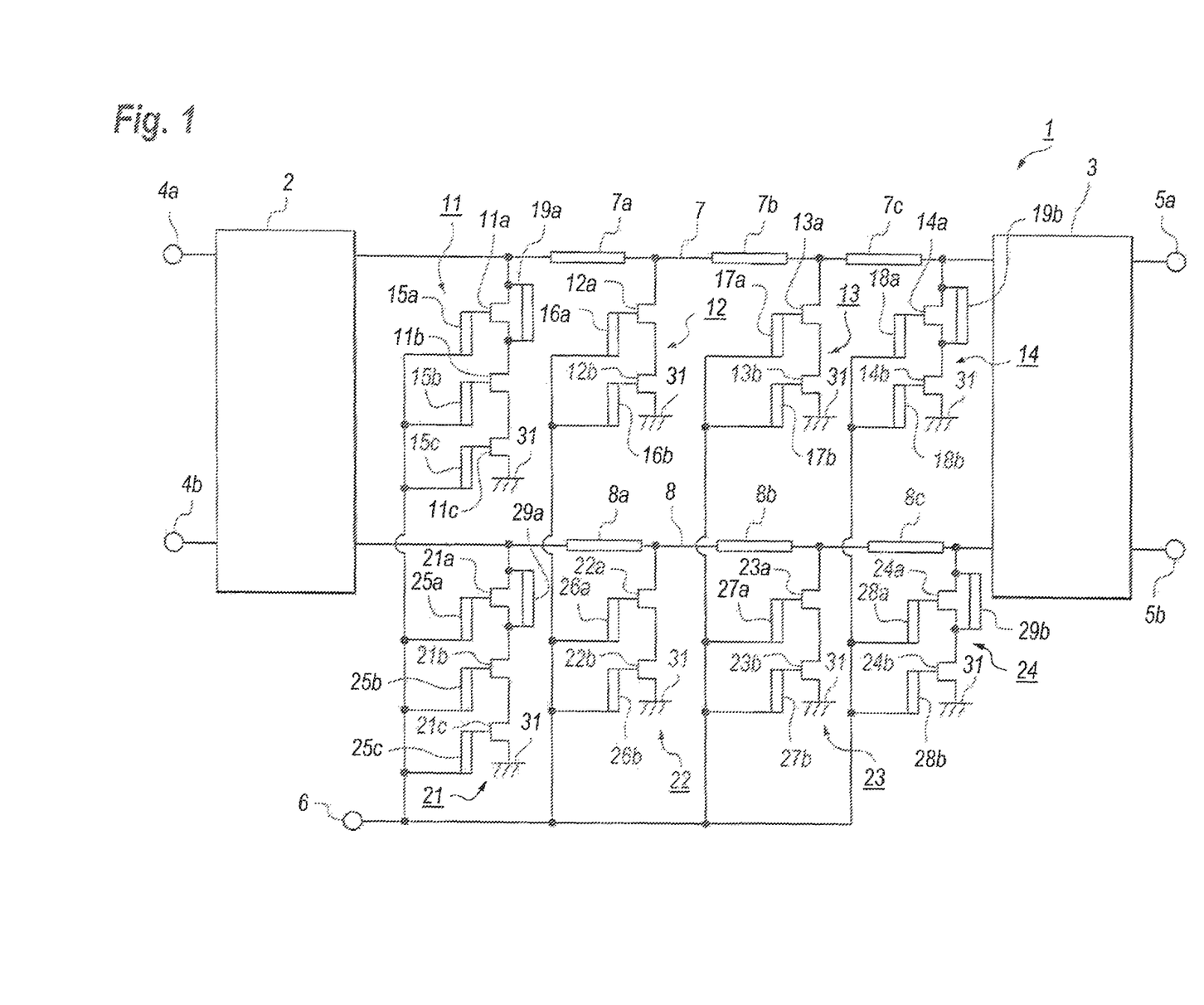
FIG. 1 schematically illustrates a block diagram of a variable attenuator according to an embodiment of the present invention.

FIG. 1 is a functional circuit diagram of a variable attenuator 1 according to an embodiment of the present invention. The variable attenuator 1 includes two hybrid couplers, 2 and 3, an input port 4a, an output port 5a, two transmission lines, 7 and 8, and two or more attenuating units, 11 to 14 and 21 to 24, each including two or more transistors type of field effect transistor (FET), two transmission lines, 19a and 19b, and other two transmission lines, 29a and 29b.

The input port 4a receives a radio frequency (RF) signal subject to the variable attenuator 1, where the RF signal has a primary frequency component exceeding 10 GHz with a preset frequency bandwidth. For instance, the RF signal may have a lowest frequency of 10 to 44 GHz, while, a highest frequency of 11 to 45 GHz. Further specifically, the RF signal has a frequency range within, what is called, the K-band used in the communication satellite system with the lowest frequency of 18 GHz and the highest frequency of 23 GHz. The RF signal entering the input port 4a may have power of 0.01 to 10 W.

The transmission lines, 7 and 8, which are a pair of first transmission lines carrying the RF signal from the input port 4a to the output port 5a, may be micro-strip lines. Specifically, the first transmission lines, 7 and 8, in respective one ends thereof are coupled with the input port 4a through the hybrid coupler 2, while, in respective other ends thereof couple with the output port 5a through the other hybrid coupler 3. One of the first transmission lines 7 includes some transmission elements, where three transmission elements, 7a to 7c, are provided in the first transmission line 7, each of which have respective electrical lengths and connected in series. Similarly, the other first transmission line 8 includes three transmission elements, 8a to 8c, with respective electrical lengths and connected in series.

The hybrid coupler 2, which has a type of 90° hybrid coupler with two input ports and two output ports, where one of the two input ports couples with the input port 4a of the variable attenuator 1 and the other of the input ports is terminated with a resistive element with impedance of 50Ω, which is not illustrated in the figures; while, the two output ports of the hybrid coupler 2 couple with the first transmission lines, 7 and 8. The hybrid coupler 2 may split the RF signal evenly to the two output ports thereof. Thus, the input RF signal may be evenly split into the respective first transmission lines, 7 and 8, with power just half of the power of the input RF signal. The split RF signals output from the output ports of the hybrid coupler 2 have respective phases with a difference therebetween of 90°. The other input port may output an RF signal entering the two output ports of the hybrid coupler 2 that are reflected in the respective first transmission lines, 7 and 8. The other input port terminated with the resistive element may reduce an RF signal outgoing the input port 4a from the hybrid coupler 2.

The other hybrid coupler 3, which is set between the transmission lines, 7 and 8, and the output port 5a, may also have a type of 90° coupler with two input ports coupling with the transmission lines, 7 and 8, and two output ports, one of which couples with the output port 5a, while, the other output port is terminated by a resistive element with impedance of 50Ω, which is not illustrated in the figures. The hybrid coupler 3 may combine RF signals each carried on the transmission lines, 7 and 8, and having respective phases with a difference of 90°, and outputs a combined RF signal to the output port 5a.

The attenuating units, 11 to 14, are connected in parallel to each other between the transmission line 7 and the ground 31. The attenuating unit 11 provided closest to the hybrid coupler 2 includes three transistors, 11a to 11c, that are connected in series between the transmission line 7 and the ground 31. Specifically, the transistor 11a in one of current terminals thereof, for instance, a drain thereof, couples with the transmission line 7, the other of the current terminals, for instance, a source thereof, couples with one of the current terminals of the next transistor 11b, the other of the current terminals of the transistor 11b couples with one of the current terminals of the next transistor 11c, and the other of the current terminals of the transistor 11c is grounded. The transistors, 11a to 11c, in respective control terminals, namely, respective gates thereof, are connected with a control port 6 through respective transmission lines, 15a to 15c. The transmission lines, 15a to 15c, provided between the control terminals of the transistors, 11a to 11c, and the common control port 6 may suppress or prevent the RF signal from leaking to the control port 6, which may be replaced with resistors. The attenuating unit 11 including three transistors, 11a to 11c, may be set closest to the hybrid coupler 2 among the attenuating units, 11 to 14, subject to the transmission line 7.

The other attenuating units, 12 to 14, include respective two transistors, 12a and 12b, 13a and 13b, and 14a and 14b. Thus, the attenuating units, 12 to 14, include lesser count of transistors compared with the attenuating unit 11 provided closest to the hybrid coupler 2, which means that the attenuating unit 11 possibly receives an RF signal with power greater than power which the rest attenuating units, 12 to 14, possibly receive. The attenuating units, 12 to 14, receive RF signals attenuated by attenuating units provided closer to the hybrid coupler 2.

The attenuating unit 14, which may be the last attenuating unit provided closest to the hybrid coupler 3, includes two transistors, 14a and 14b, connected in series between the transmission line 7 and the ground. Specifically, the upper transistor in one of the current terminals (drain) thereof couples with the transmission line 7, in another of the current terminals (source) thereof couples with one of the current terminal (drain) of the lower transistor, and in another of the current terminals (source) is grounded. The transistors, 14a and 14b, in respective control terminals (gate) are connected with the common control port 6 through respective transmission lines, 18a and 18b.

Two attenuating units, 12 and 13, provided midway between the two attenuating units, 11 and 14, interposing respective transmission elements, 7a to 7c, therebetween, have arrangements substantially same with that of the last attenuating unit 14; that is, the attenuating units, 12 and 13, each include two transistors, 12a and 12b, and 13a and 13b, connected in series between the transmission line 7 and the ground. The former attenuating unit 12 is provided in downstream the first attenuating unit 11 interposing the transmission element 7a, the latter attenuating unit 13 locates in downstream the former attenuating unit 12 interposing the transmission element 7b, and the last attenuating unit 14 is provided in downstream the latter attenuating unit 13 interposing the transmission element 7c. The two transistors, 12a and 12b, and 13a and 13b, in respective control terminals (gate) are connected with the common control port 6 through respective transmission lines, 16a to 16b, and 17a and 17b.

Three transistors, 11a to 11c, in the first attenuating unit 11 in sizes thereof, namely, gate widths thereof are equal to or smaller than widths of the two transistors, 12a and 12b, in the second attenuating unit 12 which are equal to or smaller than gate widths of the two transistors, 13a and 13b, in the third attenuating unit 13 which are equal to or smaller than gate widths of the two transistors, 14a and 14b, in the last attenuating unit 14. In an example, the three transistors, 11a to 11c, in the first attenuating unit 11 and the two transistors, 12a and 12b in the second attenuating unit 12 have the gate width of 200 μm; while, the two transistors, 13a and 13b, in the third attenuating unit 13 and the two transistors, 14a and 14b, in the last attenuating unit 14 have the gate width of 800 μm.

One of reasons why the transistors provided in downstream attenuating units have gate widths greater than the gate widths of the transistors in upstream attenuating units is to reduce resistance $R_{ds}$ between the drain and the source of the transistors. That is, the transistors, 11a to 14b, in the respective attenuating units, 11 to 14, are controlled by a control signal provided from the control port 6 common to the transistors, 11a to 14b; specifically, a gate bias intermediate between those to fully turn-off and to fully turn-on the transistors, 11a to 14b, are provided from the control port 6. Specifically, the control port 6 provides a gate bias under an attenuating condition such that the gate bias turns on the transistor but does not fully turns on the transistor not to increase distortions; that is, the gate bias flows a drain current that is about a half of a maximum drain current when the transistor fully turns on. Accordingly, the transistors, 11a to 14b, leave substantial drain-source resistance even when the gate bias turns on the transistor. The transistors, 13a to 14b, in the downstream attenuating units, 13 and 14, with greater gate widths may reduce the drain-source resistance when the transistors are moderately biased to flow the drain current that is about a half of the maximum drain current.

Two transmission lines, 19a and 19b, which are the second transmission lines in the present embodiment, may have a type of micro-strip line and behave as inductors at the frequency subject to the variable attenuator 1. Widths and lengths of the transmission lines, 19a and 19b, may determine inductance thereof.

The transmission line 19a is provided in the first attenuating unit 11 closest to the hybrid coupler 2 and in a topmost transistor 11a closest to the transmission line 7. That is, the transmission line 19a is provided in parallel to the transistor 11a, namely, between the two current terminals of the transistor 11a. The transmission line 19a in the inductance L thereof may be determined such that the inductance thereof and capacitance $C_{ds}$ inherently attributed to the transistor 11a between the two current terminals thereof cause a resonance frequency $\omega_{r1}$, exactly, $\omega_{r1}^2 \cdot C_{ds} \cdot L = 1$, within the frequency band subject to the variable attenuator 1.

The transmission line 19b is provided in the attenuating unit 14 closest to the output port 5a and the topmost transistor 14a closest to the transmission line 7 in the attenuating unit 14. Specifically, the transmission line 19b is provided in parallel to the transistor 14a, namely, in parallel to the parasitic capacitance $C_{ds}$ of the transistor 14a between two current terminals thereof. The inductance L attributed to the transmission line 19b and the capacitance $C_{ds}$ of the transistor 14a may satisfy the relation of $\omega_{r2}^2 \cdot C_{ds} \cdot L = 1$, where $\omega_{r2}$ is the resonance frequency that is set within the frequency band subject to the variable attenuator 1 to the present embodiment.

Two resonance frequencies, $\omega_{r1}$ and $\omega_{r2}$, may be set within the frequency band subject to the variable attenuator 1, or, preferably, at the highest frequency thereof or closer to the highest frequency within the band. Specifically, when the frequency band is 18 to 23 GHz, the resonance frequencies, $\omega_{r1}$ and $\omega_{r2}$, may be around 22.9 GHz.

The attenuating units, 21 to 24, which are provided between the transmission line 8 and the ground 31, may have arrangements same with those of the aforementioned attenuating units, 11 to 14. Specifically, the attenuating unit 21 provides three transistors 21a to 21c, configured in series between the transmission line 8 and the ground 31 such that the source electrodes are directly connected with the drain electrodes of the downward transistors. Also, three transistors, 21a to 21c, in respective gates thereof are connected to the common control port 6 through respective transmission lines, 25a to 25c. The attenuating unit 21 is provided closest to the input port 4a, or the hybrid coupler 2.

The second and third attenuating units, 22 and 23, include respective two transistors, 22a and 22b, and 23a and 23b, connected in series between the transmission line 8 and the ground 31. Thus, the second and third attenuating units, 22 and 23, include a lesser count of transistors compared with the first attenuating unit 21 by the reason same with that for the attenuating units, 11 to 14.

The last attenuating unit 24 also includes two transistors, 24a and 24b, connected in series between the transmission line 8 and the ground 31, where the gate electrodes thereof are connected with the common control port 6 through the respective transmission lines, 28a and 28b. The last attenuating unit 24 is provided closest to the output port 5a, or the hybrid coupler 3.

Those attenuating units, 21 to 24, are connected in parallel between the transmission line 8 and the ground 31 interposing the transmission elements, 8a to 8c; that is, the first attenuating unit 21 is provided closest to the hybrid coupler 2 without interposing any transmission elements, the second attenuating unit 22 is next provided interposing the transmission element 8a against the first attenuating unit 21, the third attenuating unit 23 is next provided interposing the transmission element 8b against the second attenuating unit 22, the fourth attenuating unit 24 is next provided interposing the transmission element 8c and closest to the output port 5a, namely, the hybrid coupler 3 interposing no transmission line.

The transistors, 21a to 21c, in the first attenuating unit 21, the two transistors, 22a and 22b, in the second attenuating unit 22, the two transistors, 23a and 23b, in the third attenuating unit 23, and the two transistors, 24a and 24b, in the last attenuating unit 24 have the gate width same with those of the transistors, 11a to 11c, in the other first attenuating unit 11, those of the transistors, 12a and 12b, in the other second attenuating unit 12, those of the transistors, 13a and 13b, in the other third attenuating unit 13, and those of the transistors, 14a and 14b, in the other last attenuating unit 14, respectively.

Two transmission lines, 29a and 29b, which are the third transmission line in the present embodiment, may be a type of micro-strip line to be operable as an inductor with the frequency band subject to the variable attenuator 1 of the present embodiment. Widths and lengths of the transmission lines, 29a and 29b, may determine the inductance thereof.

The transmission line 29a is provided in the first attenuating unit 21 provided closest to the input port 4a and in topmost transistor 21a closest to the transmission line 8. Specifically, the transmission line 29a is connected in parallel to the transistor 21a, namely, connected between two current terminals, the drain and the source, of the transistor 21a. The inductance L of the transmission line 29a may be set so as to set the resonance frequency $\omega_{r3}$ determined by the equation of $\omega_{r3}^2 \cdot L \cdot C_{ds} = 1$ within the frequency band.

The transmission line 29b is provided in the last attenuating unit 24 closest to the output port 5a, namely, closest to the hybrid coupler 3, and in the topmost transistor 24a closest to the transmission line 8. Specifically, the transmission line 29b is provided in parallel to the transistor 24a, that is, connected in parallel between two current terminals of the transistor 24a. The transmission line 29b is operable as an inductor with inductance L in the frequency band subject to the variable attenuator 1, which is set so as to satisfy the equation of $\omega_{r4}^2 \cdot L \cdot C_{ds} = 1$, where $C_{ds}$ is parasitic capacitance between the drain and the source of the transistor 24a.

Two resonance frequencies, $\omega_{r3}$ and $\omega_{r4}$, similar to the resonance frequencies, $\omega_{r1}$ and $\omega_{r2}$, for the aforementioned transmission lines, 19a and 19b, may be set within the frequency band subject to the variable attenuator 1, or, preferably, at the highest frequency thereof or closer to the highest frequency of the band. Specifically, when the frequency band is 18 to 23 GHz, the resonance frequencies, $\omega_{r3}$ and $\omega_{r4}$, may be around 22.9 GHz.

In the variable attenuator 1, setting a control signal provided to the control port 6 in an level to turn off the transistors, 11a to 14b and 21a to 24b, the drain-source resistance of the transistors, 11a to 14b and 21a to 24b becomes high impedance and the RF signal entering the input port 4a transmits on the two transmission lines, 7 and 8, showing smaller attenuation and reaches the output port 5a. Contrary, when the control signal provided to the control port 6 is set in a level to turn on the transistors, 11a to 14b and 21a to 24b, the RF signal entering the input port 4a flows in the ground 31 during the transmission on the transmission lines, 7 and 8, and only a limited portion thereof reaches the output port 5a.

Figure 2:
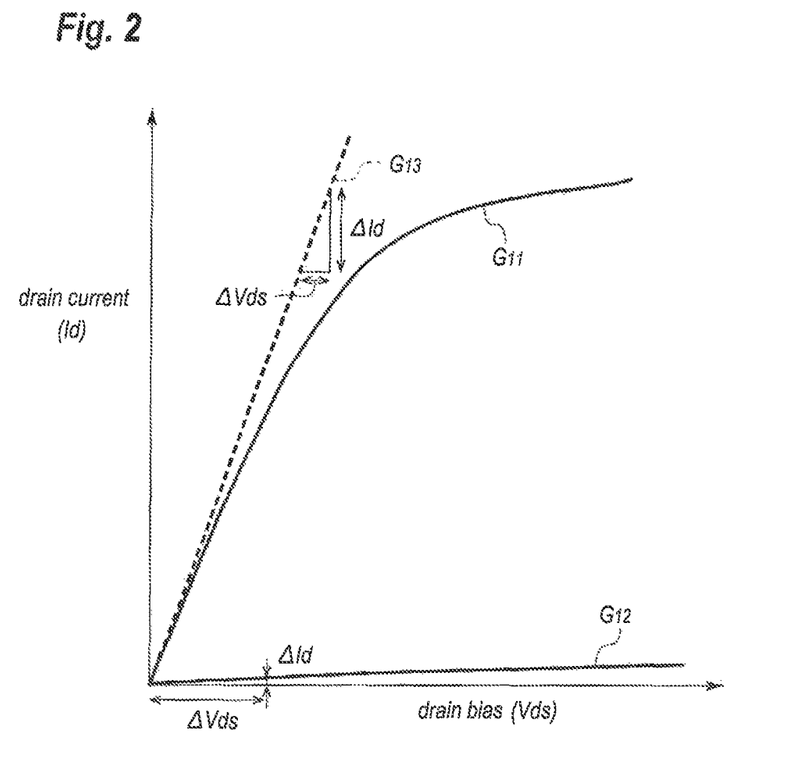
FIG. 2 schematically illustrates an operation of a transistor when the transistor turns on and off.

FIG. 2 schematically shows an operation of a transistor, where the horizontal axis corresponds to a drain bias, while, the vertical axis shows a drain current. A behavior $G_{11}$ corresponds to a condition of the drain current against the drain bias when the transistor turns on by setting a gate bias of 0V; while, another behavior $G_{12}$ corresponds to a condition where the transistor turns off by supplying a gate bias $V_{gs}$ of −5 V. As shown in FIG. 1, in the variable attenuator 1, all transistors are biased in the drain thereof to be 0 V and only supplied with the gate biases. Accordingly, the attenuation of the variable attenuator 1 may be determined by a difference between slopes $\Delta I_d/\Delta V_{ds}$ of the behaviors, $G_{13}$ and $G_{12}$, at no drain bias $V_{ds}=0$ and at two gate biases to turn on and off the transistor, respectively.

Figure 3:
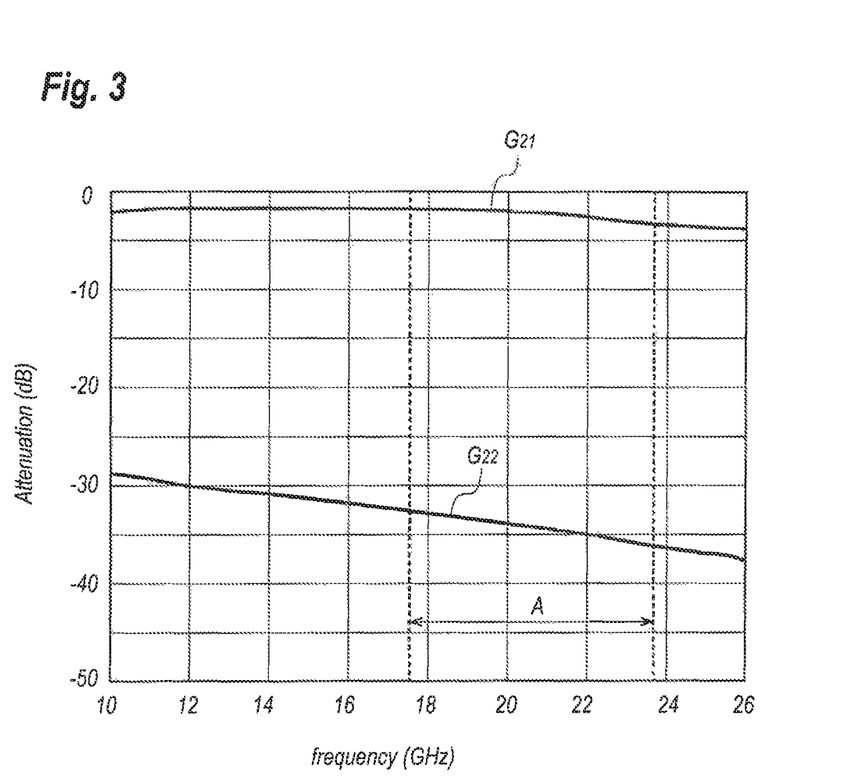
FIG. 3 shows attenuating performance of a variable attenuator that provides no transmission lines provided in parallel to transistors.
Figure 4:
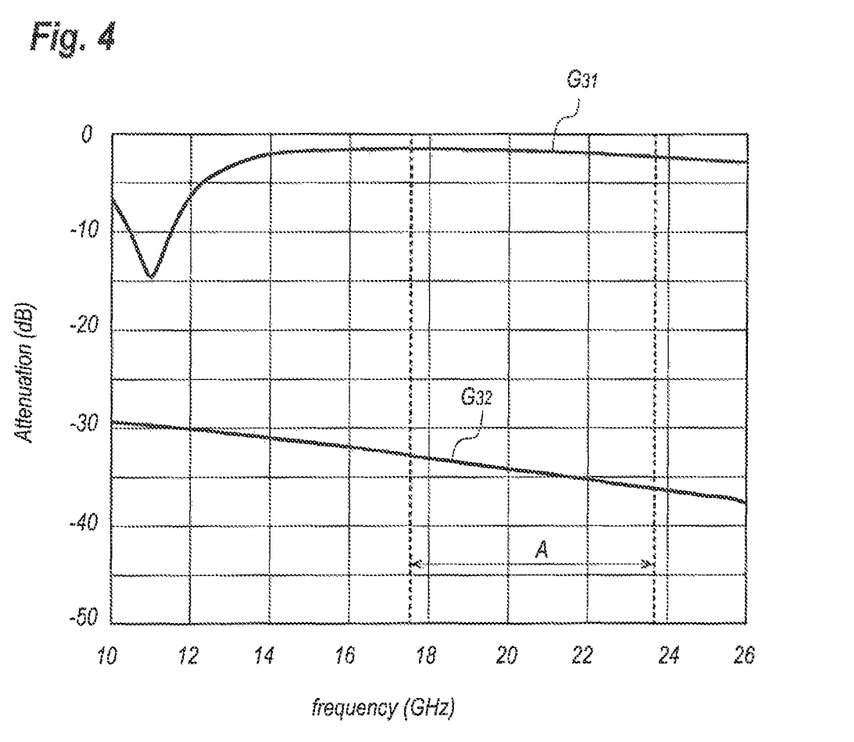
FIG. 4 shows attenuating performance of a variable attenuator according to an embodiment of the present invention, where the variable attenuator provides a transmission line connected in parallel to a transistor.

Next, advantages according to the variable attenuator 1 of the present embodiment will be described. FIG. 3 shows the attenuations of a variable attenuator when the transmission lines, 19a to 29b, in parallel to the transistors in the attenuating units, 11 and 14, and 21 and 24, are removed; while, FIG. 4 shows the attenuations of the variable attenuator 1 when the transmission lines, 19a to 29b, are implemented. Behaviors, $G_{21}$ and $G_{31}$ are obtained when all transistors, 11a to 14b and 21a to 24b, turn off by supplying the control signal of −5V, while behaviors $G_{22}$ and $G_{32}$ correspond to a status when all transistors, 11a to 14b and 21a to 24b, turn on by setting the control signal to be 0 V. A frequency range A, 17.5~23.5 GHz, in FIG. 3 and FIG. 4 correspond to the frequency band subject to the variable attenuator 1 of the present embodiment.

As the behavior $G_{22}$ indicates, the attenuation exceeds −30 dB when the transistors turn on, which becomes −32 to −36 dB within the frequency range A. However, the behavior $G_{21}$ clearly shows substantial loss of −1.6 to −2.8 dB within the frequency range A when the transistors turn off, which is unacceptable loss for an apparatus ordinarily installed in the field. This is because of the parasitic capacitance $C_{ds}$ between the drain and the source of the transistors, which splits the RF signal carried on the signal line to the ground.

The variable attenuator 1 of the present embodiment provides the transmission lines, 19a to 29b, between two current terminals in some of the transistors, where the transmission lines, 19a to 29b, operate as inductors with the inductance by which the resonance frequencies, $\omega_{r1}$ to $\omega_{r4}$, are fallen within the frequency range A. A parallel circuit of a capacitor and an inductor theoretically shows infinite impedance at the resonance frequency, but resistive elements attributed to the transmission lines, 19a to 29b, and those between the two current terminals of the transistors restrict the impedance thereof in definite value. Accordingly, the arrangement of a parallel circuit of a transistor and a transmission line between two current terminals of the transistor may set the impedance between the current terminals in substantial value, a large enough even when the transistor turns off.

In FIG. 4 where the behaviors, $G_{31}$ and $G_{32}$, correspond to statuses when the transistors turn off and turn on, respectively, for the variable attenuator implementing the transmission lines, 19a to 29b, where the those transmission lines, 19a to 29b, are set in the widths and the lengths thereof such that the resonance frequencies, $\omega_{r1}$ to $\omega_{r4}$, become 29 GHz; specifically, the transmission lines, 19a and 29a, have the width of 10 μm and the length of 220 μm, while, the transmission lines, 19b and 29b, have the width of 10 μm and the length of 320 μm, which sets the inductance of the former transmission lines, 19a and 29a, to be 0.18 nH, while, that of the latter transmission lines, 19b and 29b, to be 0.26 nH, respectively. Because the transistors, 14a and 24a, in the respective final attenuating units, 14 and 24, have the gate width greater than that of the transistors, 11a and 21a, in the initial attenuating units, 11 and 21; the former transistors, 14a and 24a, inherently have the parasitic capacitance $C_{ds}$ between the two current terminals thereof that is greater than that of the latter transistors, 11a and 21a; accordingly, the inductance attributed to the transmission lines, 19b and 29b, connected in parallel to the former two transistors, 14a and 24a, become small compared with that attributed to the transmission lines, 19a and 29a, in order to set the resonance frequencies of the respective parallel circuits equal to each other.

As the behavior $G_{32}$ shows that the attenuation becomes −32 dB to −36 dB in the frequency range A when the transistors turn on, which is comparable to the variable attenuator without the transmission lines, 19a to 29b, indicated by the behavior $G_{22}$ in FIG. 3. However, the attenuation in the frequency range A when the transistors turn off, as shown by the behavior $G_{31}$, becomes −1.6 to −2.1 dB, which becomes closer to the theoretical, or ideal, amount of 0 dB compared with the behavior $G_{21}$ shown in FIG. 3. Thus, the transmission lines, 19a to 29b, may reduce the loss when that variable attenuator 1 is set in a pass status.

The attenuating units, 11 to 14 and 21 to 24, may include two or more transistors each connected in series between the respective transmission lines, 7 and 8, and the ground 31, which may suppress signal amplitudes caused in the respective transistors. That is, the amplitude of the RF signal transmitting on the transmission lines, 7 and 8, are split by the transistors connected in series between the transmission lines, 7 and 8, and the ground. Accordingly, one transistor receives the split amplitude of the RF signal.

The transistors, 11a to 14b and 21a to 24b, preferably accompany with transmission lines operable as inductors. However, those transmission lines occupy substantial areas to makes the variable attenuator large. Accordingly, the variable attenuator 1 of the invention provides the transmission lines, 19a to 29b, only in the transistors, 11a, 21a, 14a and 24a, closest to the transmission lines, 7 and 8, and closest to the hybrid couplers, 2 and 3, respectively. Those transistors closest to the transmission lines, 7 and 8, receive the largest power from the RF signal. Accordingly, the transmission lines, 19a to 29b, provided only in the transistors, 11a, 14a, 21a, and 24a, may show the function of eliminating the signal loss most effectively.

Also, in the variable attenuator 1, only the limited transistors, 11a and 21a, may accompany with the transmission lines, 19a and 29a, because those transistors, 11a and 21a, are arranged closest to the hybrid coupler 2 and exposed to the respective output terminals of the hybrid coupler 2. On the other hand, the transistors, 12a, 13a, 22a, and 23a, are indirectly exposed to the output terminals of the hybrid coupler 2 masked by the transmission lines, 7a, 7b, 8a, and 8b, respectively, which may moderate the function of transmission lines connected in parallel to transistors. The transmission lines, 19a and 29a, are preferably accompanied with the transistors, 11a and 21a, in the uppermost one in the attenuating units, 11 and 21, closest to the hybrid coupler 2.

Also, in the variable attenuator 1, only the limited transistors, 14a and 24a, may provide the transmission lines, 19b and 29b, because those transistors, 14a and 24a, are disposed closest to the transmission lines, 7 and 8, in the attenuating units, 14 and 24, arranged closest to the hybrid coupler 3. As described, an attenuating unit provided closer to the hybrid unit 3 usually includes transistors with larger sizes, which means that those transistors inherently attribute to large parasitic capacitance $C_{ds}$ and cause substantial leak paths for the RF signal. Accordingly, the arrangement where the transistors, 14a and 24a, disposed closest to the transmission lines, 7 and 8, in the attenuating units, 14 and 24, disposed closest to the hybrid coupler 3 accompany the transmission lines, 19b and 29b, may show most effective function to reduce the signal loss when the transistors, 11a to 24b, turn off.

The embodiment of the variable attenuator 1 thus described provides the transmission lines, 19a to 29b, in both of the attenuating units, 11 and 14, and 21 and 24, disposed closest to the hybrid couplers, 2 and 3. However, a variable attenuator may provide a transmission line only one of the attenuating units, 11 and 14, and 21 and 24. Also, the transistors, 11a to 24b, accompany the transmission lines, 15a to 28b, in the control terminals thereof to prevent the RF signal from leaking from the current terminal to the control port 6. However, in an alternative, those transmission lines, 15a to 28b, may be replaced to resistors because substantially no currents leak from the current terminals to the control terminals of the transistors, 11a to 24b.

The variable attenuator according to the present invention is not restricted to the embodiment described above, and may have various changes and modifications. For instance, the attenuating units, 11 to 24, of the embodiment include two or more transistors connected in series between the transmission lines, 7 and 8, and the ground 31. However, the attenuating units, 11 to 24, may include only one transistor with the current terminals connected to the transmission lines, 7 and 8, and the ground 31. Also, the transmission lines operable as an inductor may be provided in transistors not closest to the transmission lines, 7 and 8, and in all transistors in the attenuating units, 11, 14, 21, and 24, disposed closest to the hybrid couplers, 2 and 3. Also, the transistors in the attenuating units, 12, 13, 22, and 23, disposed intermediate to the hybrid couplers, 2 and 3, may accompany with the transmission lines. Accordingly, the present invention has a scope defined in the claims attached below and all modifications and the changes for elements recited in the claims and equivalents thereto.

What is claimed is:

1. A variable attenuator for a frequency band of a range with a lower end of at least 10 GHz comprising:
   an input port and an output port;
   a first transmission line connecting the input port with the output port;
   an attenuating unit provided between the first transmission line and ground, the attenuating unit including at least one transistor having two current terminals coupled with the first transmission line and the ground, respectively, and other transistors; and
   a second transmission line connected between the two current terminals of the at least one transistor, the second transmission line operating as an inductor in the frequency band,
   wherein the at least one transistor and the second transmission line cause a resonance frequency formed by a capacitor between the two current terminals of the at least one transistor and the inductor attributed to the second transmission line, the resonance frequency being within the frequency band,
   wherein the other transistors are connected in series between the first transmission line and the ground, and
   wherein the at least one transistor with the second transmission line between the two current terminals thereof is disposed closest to the first transmission line.

2. The variable attenuator according to claim 1,
   further including other attenuating units provided in parallel between the first transmission line and the ground and between the input port and the output port, the other attenuating units each providing at least one transistor,
   wherein the attenuating unit that provides the at least one transistor where the second transmission line is connected between the two current terminals thereof is disposed closet to the input port.

3. The variable attenuator according to claim 2,
   wherein the first transmission line provides transmission elements between the attenuating units.

4. The variable attenuator according to claim 2,
   wherein one of the other attenuating units is disposed closest to the output port and has a transistor with a size greater than a size of the at least one transistor in the attenuating unit disposed closest to the input port.

5. The variable attenuator according to claim 1,
   further including other attenuating units each provided in parallel between the first transmission line and the ground and between the input port and the output port, the other attenuating units each providing at least one transistor,
   wherein one of the other attenuating units is disposed closest to the output port and provides a transistor where another second transmission line is connected between the two current terminals thereof.

6. The variable attenuator according to claim 5,
   wherein the first transmission line provides transmission elements between the attenuating units.

7. The variable attenuator according to claim 5,
   wherein the transistor in the one attenuating unit disposed closest to the output port has a size greater than a size of the at least one transistor in the attenuating unit disposed closest to the input port.

8. The variable attenuator according to claim 1,
   further including one or more other attenuating units each provided in parallel between the first transmission line and the ground and between the input port and the output port, the other attenuating units each providing at least one transistor,
   wherein the attenuating unit that has the at least one transistor is disposed closest to the input port and one of the other attenuating units that is disposed closest to the output port each provide transistors with second transmission lines between the two current terminals thereof.

9. The variable attenuator according to claim 8,
   wherein the first transmission line provides transmission elements between the attenuating units.

10. The variable attenuator according to claim 8,
    wherein the transistor in the attenuating unit disposed closest to the output port has a size greater than a size of the at least one transistor in the attenuating unit disposed closest to the input port.

11. The variable attenuator according to claim 10,
    wherein, in the attenuating unit disposed closest to the output port, the transistor and the second transmission line cause a second resonance frequency formed by a capacitor between the two current terminals of the transistor and the inductance of the second transmission line connecting the two current terminals, wherein, in the attenuating unit disposed closest to the input port, the resonance frequency formed by the capacitor between the two current terminals of the transistor and the inductance of the second transmission line connecting the two current terminals is a first resonance frequency, and wherein the first resonance frequency and the second resonance frequency are within the frequency band.

12. A variable attenuator for a frequency band of a range with a lower end of at least 10 GHz, comprising:

an input port and an output port;

a first transmission line connecting the input port with the output port;

a first attenuating unit provided between the first transmission line and ground, the attenuating unit included at least one transistor having two current terminals coupled with the first transmission line and ground, respectively;

a second transmission line connected between the two current terminals of the transistor of the first attenuating unit, the second transmission line operating as an inductor in the frequency band; and one or more other attenuating units provided in parallel between the first transmission line and the ground and between the input port and the output port, the other attenuating units each providing at least one transistor, wherein the transistor of the first attenuating unit and the second transmission line cause a resonance frequency formed by a capacitor between the two current terminals of the transistor of the first attenuating unit and the inductor attributed to the second transmission line, the resonance frequency being within the frequency band, wherein the first attenuating unit is disposed closest to the input port, and wherein one of the other attenuating units is disposed closest to the output port and the transistor in the attenuating unit closest to the output port has a size greater than a size of the transistor in the first attenuating unit.

13. A variable attenuator for a frequency band of a range with a lower end of at least 10 GHz, comprising:

an input port and an output port;

a first transmission line connecting the input port with the output port;

a first attenuating unit provided between the first transmission line and ground, the attenuating unit including at least one transistor having two current terminals coupled with the first transmission line and the ground, respectively;

a second transmission line connected between the two current terminals of the transistor of the first attenuating unit, the second transmission line operating as an inductor in the frequency band; and one or more other attenuating units each provided in parallel between the first transmission line and the ground and between the input port and the output port, the other attenuating units each providing at least one transistor, wherein the transistor of the first attenuating unit and the second transmission line cause a resonance frequency formed by a capacitor between the two current terminals of the transistor of the first attenuating unit and the inductor attributed to the second transmission line, the resonance frequency being within the frequency band, wherein one of the other attenuating units is disposed closest to the output port and provides a transistor where another second transmission line is connected between the two current terminals thereof, and wherein the transistor in the attenuating unit disposed closest to the output port has a size greater than a size of the transistor m the first attenuating unit.

* * * * *